(12) United States Patent
Kim et al.

(10) Patent No.: US 7,608,192 B2
(45) Date of Patent: Oct. 27, 2009

(54) IMAGE SENSOR AND METHOD FOR FABRICATING THE SAME

(76) Inventors: Hee Jeen Kim, 1 Hyangjeong-dong, Heungduk-gu, Cheongju-si, Chungcheongbuk-do, 361-725 (KR); Han Seob Cha, 1 Hyangjeong-dong, Heungduk-gu, Cheongju-si, Chungcheongbuk-do, 361-725 (KR)

( * ) Notice: Subject to any disclaimer, the term of this patent is extended or adjusted under 35 U.S.C. 154(b) by 127 days.

(21) Appl. No.: 11/408,206

(22) Filed: Apr. 19, 2006

(65) Prior Publication Data
US 2007/0026326 A1    Feb. 1, 2007

(30) Foreign Application Priority Data
Jul. 11, 2005  (KR)  ............... 10-2005-0062300

(51) Int. Cl.
*H01B 13/00*  (2006.01)
(52) U.S. Cl. ............... 216/13; 438/134; 438/181; 257/22; 257/233; 257/292
(58) Field of Classification Search ............... 216/13; 438/134; 257/292
See application file for complete search history.

(56) References Cited

U.S. PATENT DOCUMENTS

| | | | |
|---|---|---|---|
| 6,504,195 B2 * | 1/2003 | Guidash | ............... 257/292 |
| 6,570,201 B2 | 5/2003 | Shim | |
| 6,611,037 B1 | 8/2003 | Rhodes | |
| 6,806,522 B2 | 10/2004 | Ohkubo | |
| 7,015,089 B2 * | 3/2006 | Hsu et al. | ............... 438/241 |
| 7,045,380 B2 | 5/2006 | Kim | |
| 2004/0180458 A1 | 9/2004 | Yi-tae | |
| 2004/0188727 A1 | 9/2004 | Patrick | |
| 2005/0062078 A1 | 3/2005 | Han | |
| 2005/0167711 A1 * | 8/2005 | Mouli et al. | ............... 257/292 |

FOREIGN PATENT DOCUMENTS

| | | | |
|---|---|---|---|
| EP | 0403936 | * | 6/1990 |
| JP | 2002-353467 | * | 12/2002 |
| JP | 2002353467 | * | 12/2002 |
| KR | 2002-0030959 | | 4/2002 |
| KR | 10-2005-0040262 | | 5/2005 |

OTHER PUBLICATIONS

H. Schafer, Applied Surface Science, vol. 224, (2004), pp. 18-23.*

* cited by examiner

*Primary Examiner*—Nadine Norton
*Assistant Examiner*—Maki Angadi
(74) *Attorney, Agent, or Firm*—McAndrews, Held & Malloy Ltd.

(57) ABSTRACT

An image sensor and a method for fabricating the same are provided. The image sensor includes a first conductive type substrate including a trench formed in a predetermined portion of the first conductive type substrate, a second conductive type impurity region for use in a photodiode, formed below a bottom surface of the trench in the first conductive type substrate, and a first conductive type epitaxial layer for use in the photodiode, buried in the trench.

15 Claims, 4 Drawing Sheets

IMAGE SENSOR AND METHOD FOR FABRICATING THE SAME

1. FIELD OF THE INVENTION

The present invention relates to a method for fabricating a semiconductor device; and, more particularly, to a method for fabricating an image sensor.

2. Description of Related Arts

An images sensor is a device which converts more than one- or two-dimensional optical information into electrical signals. Images sensors can be largely categorized into image orthicon and solid state imaging device. The image orthicon has been widely used in areas such as measurement, control and recognition, especially in TV, using image processing technology, and applied technologies related to the image orthicon have been developed. The solid state imaging device can be largely categorized into metal oxide semiconductor (MOS) type and charge coupled device type.

On the other hand, the image sensor has used a pinned photodiode as an optical sensor. Herein, the pinned photodiode is used to maintain a dark current by nullifying a state of a silicon-silicon oxide layer interface using a shallow P-type doping region, i.e., pinning layer, disposed adjacent to the silicon-silicon oxide layer interface of a photodiode region.

FIG. 1 is a cross-sectional view illustrating a conventional method for fabricating an image sensor.

Referring to FIG. 1, device isolation layers 104 are formed in a substrate 103 to separate an active region and device isolation regions. Herein, the substrate 103 includes a P-epitaxial layer 102 formed over a $P^+$-type substrate 101.

Subsequently, a gate insulation layer 105 and a gate conductive layer 106 are sequentially formed over the device isolation layers 104 and the substrate 103. Then, the gate insulation layer 105 and the gate conductive layer 106 are selectively etched to form a gate electrode 107.

Furthermore, a first impurity region 108 is formed by implanting N-type impurities where a photodiode is to be formed. Herein, the first impurity region 108 is formed to self-align with an edge of the gate electrode 107.

Moreover, spacers 109 are formed on sidewalls of the gate electrode 107.

Next, an ion implantation prevention layer is formed over predetermined upper portions of the first impurity region 108 and the gate electrode 107, and then, highly concentrated P-type impurities are implanted into the substrate 103 to form a floating diffusion region 110.

Subsequently, a second impurity region 111 is formed as a pinning layer in the substrate 103 where the first impurity region 108 is formed, by implanting P-type impurities. Herein, the second impurity region 111 is formed to self-align with an edge of one individual spacer 109 formed on the sidewall of the gate electrode 107.

At this time, the second impurity region 111 is formed as the pinning layer of a pinned photodiode, and has been formed by employing an ion implantation and an annealing process conventionally. That is, an ion implantation process with extremely low energy is performed onto a substrate, and then, an annealing process for activating dopants implanted into the substrate is performed.

On the other hand, a P-type doping region, i.e., the pinning layer, is generally required to have a higher doping concentration level than an N-type doping region and to be formed extremely shallow from the surface of a silicon substrate. The pinning layer is generally required to have a high doping concentration level because photoproduction efficiency should be maximized by fully depleting the N-type doping region. Also, the pinning layer is generally required to be formed shallow to increase light sensitivity toward hypsochromic shift, especially blue shift, because transmissivity of the hypsochromic shift through a silicon layer is very low.

However, as image sensors have become highly integrated, it has become difficult to form the highly concentrated and shallow pinning layer through the conventional technique of employing the ion implantation and the annealing process.

That is, even if the ion implantation process is performed with low energy, a depth (thickness) of the pinning layer becomes larger due to diffusion of the dopants during the annealing process, because the pinning layer is highly concentrated. Furthermore, in a more highly integrated device, the depth of a pinning layer corresponding to the desired design rule cannot be obtained even when the minimum amount of ion implantation energy is used. Thus, there arise difficulties such as purchasing or developing additional apparatuses.

Furthermore, the ion implantation process inevitably generates defects on the surface of a substrate due to characteristics of the process. Thus, such defects function as a dangling bond on the surface of the substrate and generate noise.

SUMMARY OF THE INVENTION

It is, therefore, an object of the present invention to provide a photodiode having a highly integrated, highly concentrated, and shallow pinning layer, and a method for fabricating the same.

It is another object of the present invention to provide a photodiode with less noise by reducing a defect generation in a substrate surface of a photodiode region, and a method for fabricating the same.

In accordance with an aspect of the present invention, there is provided an image sensor, including: a first conductive type substrate including a trench formed in a predetermined portion of the first conductive type substrate; a second conductive type impurity region for use in a photodiode, formed below a bottom surface of the trench in the first conductive type substrate; and a first conductive type epitaxial layer for use in the photodiode, buried in the trench.

In accordance with another aspect of the present invention, there is provided a method for fabricating an image sensor, including: preparing a first conductive type substrate; forming a second conductive type impurity region in a predetermined portion of the first conductive type substrate; etching the predetermined portion of the first conductive type substrate to form a trench; and burying a first conductive type epitaxial layer in the trench.

In accordance with still another aspect of the present invention, there is provided an image sensor, including: a first conductive type substrate; a second conductive type impurity region formed in a predetermined region of the first conductive type substrate; and a first conductive type epitaxial layer formed over the second conductive type impurity region.

In accordance with further aspect of the present invention, there is provided a method for fabricating an image sensor, including: preparing a first conductive type substrate; forming a second conductive type impurity region in a predetermined portion of the first conductive type substrate; forming a mask pattern exposing the predetermined portion of the first conductive type substrate; and forming a first conductive type epitaxial layer over the exposed portion of the first conductive type substrate.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

An image sensor and a method for fabricating the same in accordance with specific embodiments of the present invention will be described in detail with reference to the accompanying drawings.

Hereinafter, a first embodiment of the present invention is described.

Figure 1:
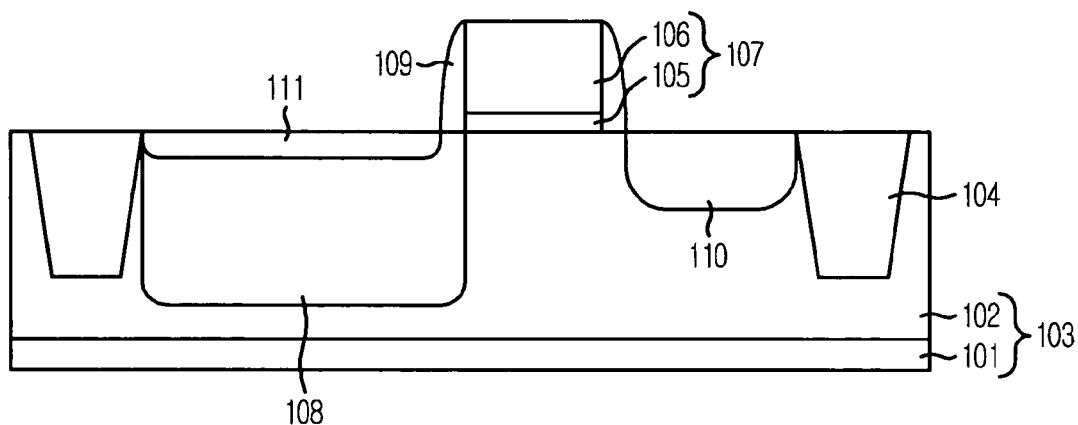
FIG. 1 is a cross-sectional view illustrating a conventional method for fabricating an image sensor.
Figure 2:
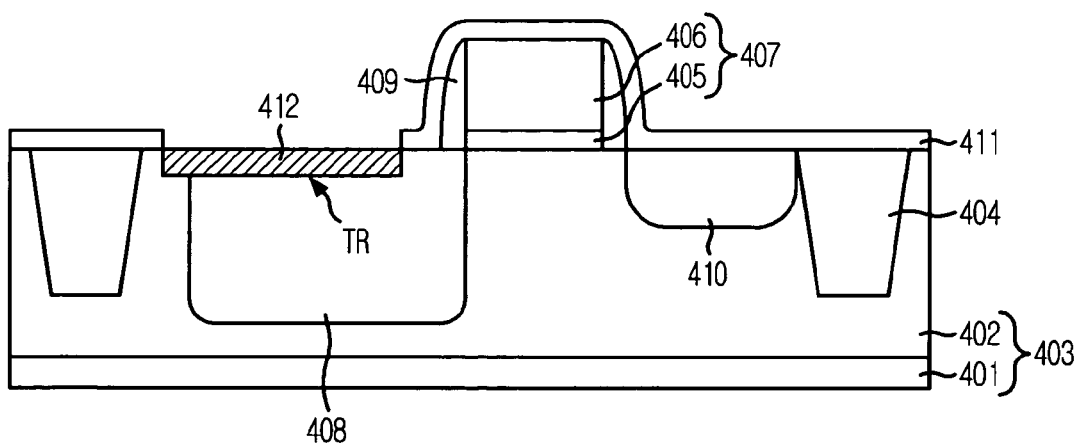
FIG. 2 is a cross-sectional view illustrating an image sensor in accordance with a first embodiment of the present invention.

FIG. 2 is a cross-sectional view illustrating an image sensor in accordance with a first embodiment of the present invention.

Referring to FIG. 2, device isolation layers 404 are formed in a first conductive type substrate 403 to define an active region and device isolation regions. Herein, the first conductive type substrate 403 includes a P-epitaxial layer 402 formed over a P$^+$-type substrate 401.

At this time, the first conductive type substrate 403 may include silicon.

Subsequently, a gate electrode 407 is formed over the active region of the first conductive type substrate 403, wherein the gate electrode 407 includes a gate insulation layer 405 and a gate conductive layer 406 formed in sequential order. Furthermore, spacers 409 are formed on sidewalls of the gate electrode 407.

Furthermore, a floating diffusion region 410 is formed in the first conductive type substrate 403 on one side of the gate electrode 407.

Moreover, a trench TR is formed in a predetermined portion of the first conductive type substrate 403 on the other side of the gate electrode 407 where a photodiode is to be formed, and a second conductive type impurity region 408 for use in the photodiode is formed in the first conductive type substrate 403 below the bottom surface of the trench TR.

At this time, the trench TR may be formed in a thickness ranging from approximately 1 Å to approximately 100 Å.

Next, a first conductive type epitaxial layer 412 is buried in the trench TR, and a silicon nitride layer 411 exposing the first conductive type epitaxial layer 412 is formed over the substrate structure.

Herein, the first conductive type epitaxial layer 412 is formed as a pinning layer and can be doped with first conductive type impurities in-situ during growth.

Furthermore, the first conductive type epitaxial layer 412 includes one of silicon (Si) and silicon germanium (SiGe), and can be formed to contact the first conductive type substrate 403.

Figure 3A:
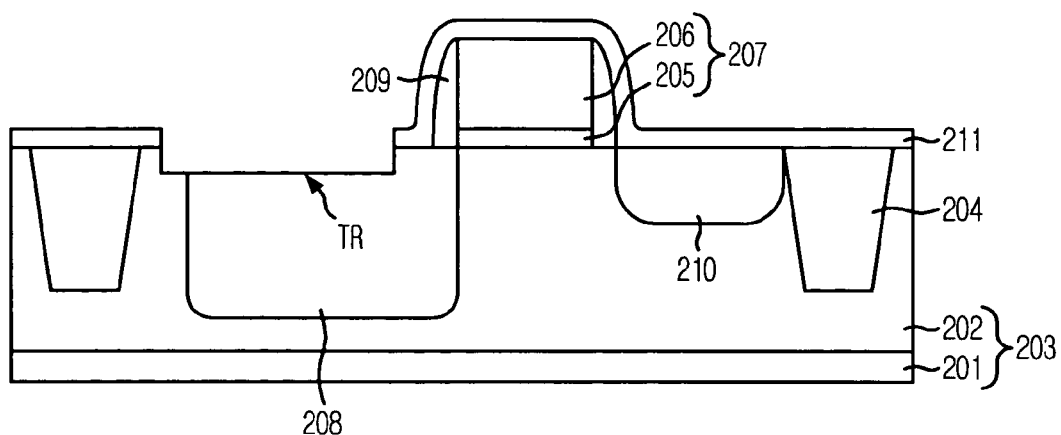
FIGS. 3A and 3B are cross-sectional views illustrating a method for fabricating an image sensor in accordance with the first embodiment of the present invention.
Figure 3B:
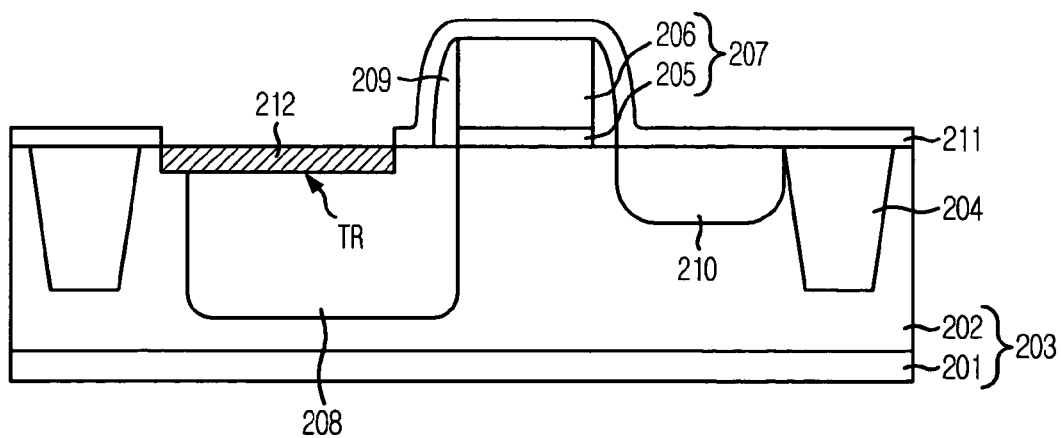

FIGS. 3A and 3B are cross-sectional views illustrating a method for fabricating an image sensor in accordance with the first embodiment of the present invention.

In the method for fabricating an image sensor in accordance with the first embodiment, as shown in FIG. 3A, device isolation layers 204 are formed in a first conductive type substrate 203 to define an active region and device isolation regions. Herein, the first conductive type substrate 203 includes a P-epitaxial layer 202 formed over a P$^+$-type substrate 201.

At this time, the first conductive type substrate 203 may include silicon.

One reason for using the lowly doped P-epitaxial layer 202 formed over the highly doped P$^+$-type substrate 201 is because the existence of the lowly doped P-epitaxial layer 202 allows a larger and deeper increase of a depletion region of a photodiode, and thus, ability of the photodiode for concentrating photo charges can be increased. Another reason is because having the highly doped P$^+$-type substrate 201 below the P-type epitaxial layer 202 allows fast recombination of electric charges before the electric charges diffuse into an adjacent unit pixel. Thus, random diffusion of the photo charges can be reduced, resulting in reduced delivery function fluctuation of the photo charges.

Moreover, because the device isolation layers 204 generally do not have bird's beaks, the device isolation layers 204 are formed by employing a shallow trench isolation (STI) process which can reduce regions that electrically isolate devices, as the devices are becoming highly integrated.

Subsequently, a gate insulation layer 205 and a gate conductive layer 206 are formed over the first conductive type substrate 203 and the device isolation layers 204, and then, selectively etched to form a gate electrode 207.

Furthermore, a second conductive type impurity region 208 is formed by implanting N-type impurities where the photodiode is to be formed, such that, the second conductive type impurity region 208 is self-aligned with an edge of the gate electrode 207.

Moreover, spacers 209 are formed on sidewalls of the gate electrode 207.

The spacers 209 can be formed by: sequentially forming a buffer oxide layer and a nitride layer for use in spacers over the gate electrode 207 and the first conductive type substrate 203; and performing a dry etching process.

Then, an ion implantation prevention layer is formed over predetermined upper portions of the second conductive type impurity region 208 and the gate electrode 207, and then, highly concentrated P-type impurities are implanted into the first conductive type substrate 203 to form a floating diffusion region 210.

Next, a silicon nitride layer 211 is formed over the above resulting substrate structure. Herein, the silicon nitride layer 211 is formed to be used as an etch stop layer during a subsequent contact hole formation process.

Subsequently, a predetermined region of the substrate structure, where the photodiode is to be formed, is exposed by selectively etching the silicon nitride layer 211.

As shown in FIG. 3B, the first conductive type substrate 203 is etched using the silicon nitride layer 211 as an etch barrier to form a trench TR over the second conductive type impurity region 208.

At this time, the trench TR is formed in a depth ranging from approximately 1 Å to approximately 100 Å.

Furthermore, a first conductive type epitaxial layer 212 is buried in the trench TR.

Herein, the first conductive type epitaxial layer 212 is formed as a pinning layer including one of Si and SiGe, and can be doped with first conductive type impurities in-situ.

Also, the first conductive type epitaxial layer 212 can be formed to contact the first conductive type substrate 203.

Moreover, when forming the first conductive type epitaxial layer 212 with SiGe, an Si source selected from the group consisting of di-chloro-silane (DSC), silane ($SiH_4$), and disilane ($Si_2H_6$) and a Ge source of germane ($GeH_4$) is used at a temperature ranging from approximately 500° C. to approximately 900° C. by employing a selective epitaxial growing (SEG) method.

Furthermore, when forming the first conductive type epitaxial layer 212 with Si, the first conductive type epitaxial layer 212 is formed at a temperature ranging from approximately 550° C. to approximately 900° C., using the SEG method.

Also, the first conductive type impurities contained in the first conductive type epitaxial layer 212 can be doped in-situ using a diborane ($B_2H_6$) source gas at a doping concentration level ranging from approximately $1 \times 10^{18}$ $cm^{-3}$ to approximately $5 \times 10^{21}$ $cm^{-3}$.

Hereinafter, a second embodiment of the present invention is described.

Figure 4:
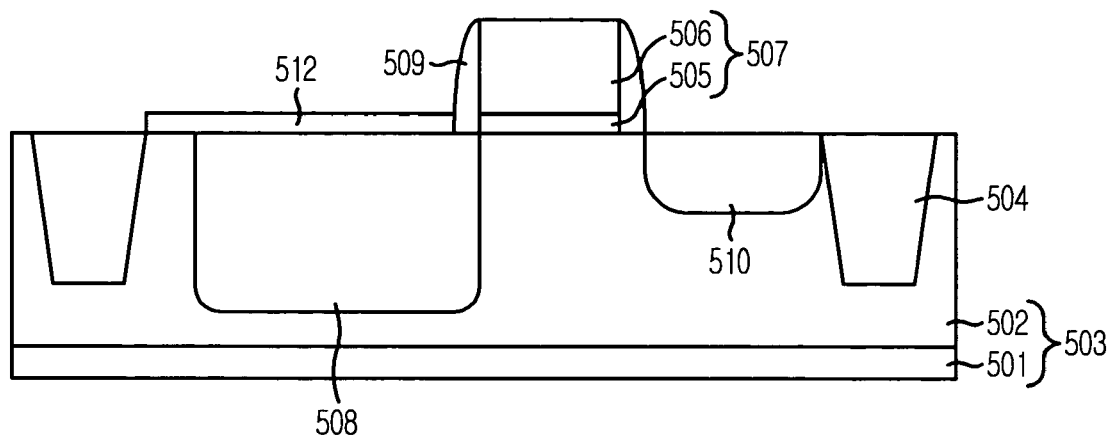
FIG. 4 is a cross-sectional view illustrating an image sensor in accordance with a second embodiment of the present invention.

FIG. 4 is a cross-sectional view illustrating an image sensor in accordance with a second embodiment of the present invention.

Referring to FIG. 4, device isolation layers 504 are formed in a first conductive type substrate 503 to define an active region and device isolation regions. Herein, the first conductive type substrate 503 includes a P-epitaxial layer 502 formed over a $P^+$-type substrate 501.

At this time, the first conductive type substrate 503 may include silicon.

Subsequently, a gate electrode 507 is formed over the active region of the first conductive type substrate 503, wherein the gate electrode 507 includes a gate insulation layer 505 and a gate conductive layer 506 formed in sequential order. Furthermore, spacers 509 are formed on sidewalls of the gate electrode 507.

Furthermore, a floating diffusion region 510 is formed in the first conductive type substrate 503 on one side of the gate electrode 507.

Moreover, a second conductive type impurity region 508 is formed in the first conductive type substrate 503, where a photodiode is to be formed, on the other side of the gate electrode 507. Then, a first conductive type epitaxial layer 512 is formed as a pinning layer over the above resulting substrate structure.

At this time, the first conductive type epitaxial layer 512 is formed to contact the first conductive type substrate 503, and can be formed in a thickness ranging from approximately 50 Å to approximately 500 Å. Herein, the first conductive type epitaxial layer 512 can be doped with P-type impurities, i.e., first conductive type impurities, in-situ.

Figure 5A:
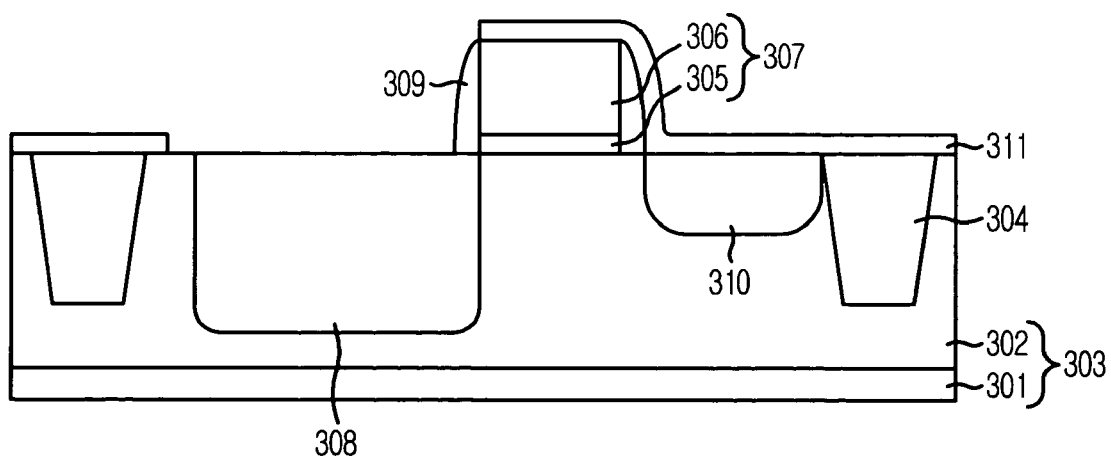
FIGS. 5A and 5B are cross-sectional views illustrating a method for fabricating an image sensor in accordance with the second embodiment of the present invention.
Figure 5B:
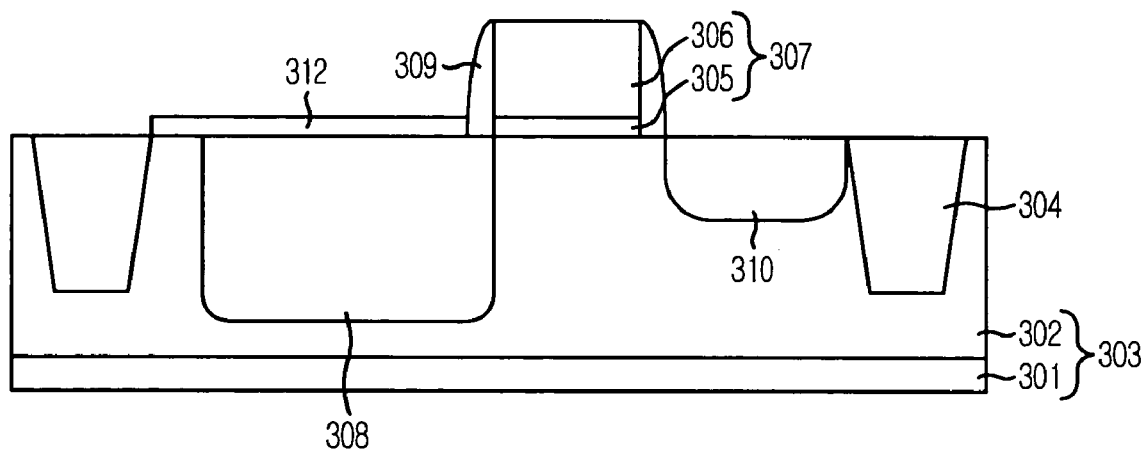

FIGS. 5A and 5B are cross-sectional views illustrating a method for fabricating an image sensor in accordance with the second embodiment of the present invention.

In the method for fabricating an image sensor in accordance with the second embodiment, as shown in FIG. 5A, device isolation layers 304 are formed over a first conductive type substrate 303 to define an active region and device isolation regions. Herein, the first conductive type substrate 303 includes a P-epitaxial layer 302 formed over a $P^+$-type substrate 301.

At this time, the first conductive type substrate 303 may include silicon.

One reason for using the lowly doped P-epitaxial layer 302 formed over the highly doped $P^+$-type substrate 301 is because the existence of the lowly doped P-epitaxial layer 302 allows a larger and deeper increase of a depletion region of a photodiode, and thus, ability of the photodiode for concentrating photo charges can be increased. Another reason is because having the highly doped $P^+$-type substrate 301 below the P-type epitaxial layer 302 allows fast recombination of electric charges before the electric charges diffuse into an adjacent unit pixel. Thus, random diffusion of the photo charges can be reduced, resulting in reduced delivery function fluctuation of the photo charges.

Moreover, because the device isolation layers 304 generally do not have bird's beaks, the device isolation layers 304 are formed by employing a shallow trench isolation (STI) process which can reduce regions that electrically isolate devices, as the devices are becoming highly integrated.

Subsequently, a gate insulation layer 305 and a gate conductive layer 306 are formed over the first conductive type substrate 303 and the device isolation layers 304, and then, selectively etched to form a gate electrode 307.

Furthermore, a second conductive type impurity region 308 is formed by implanting N-type impurities where the photodiode is to be formed, such that, the second conductive type impurity region 308 is self-aligned with an edge of the gate electrode 307.

Moreover, spacers 309 are formed on sidewalls of the gate electrode 307.

The spacers 309 can be formed by: sequentially forming a buffer oxide layer and a nitride layer for use in spacers, over the gate electrode 307 and the first conductive type substrate 303; and performing a dry etching process.

Then, an ion implantation prevention layer is formed over predetermined upper portions of the second conductive type impurity region 308 and the gate electrode 307, and then, highly concentrated P-type impurities are implanted into the first conductive type substrate 303 to form a floating diffusion region 310.

Next, a mask pattern 311 is formed over the above resulting substrate structure.

Herein, the mask pattern 311 may be an oxide layer formed by employing a chemical vapor deposition (CVD) method.

Subsequently, a predetermined portion of the mask pattern 311 is removed where the photodiode is to be formed.

At this time, the mask pattern 311 is etched by employing an etching process using hydrogen chloride (HCl). The etching process using HCl may be performed at a temperature ranging from approximately 500° C. to approximately 5,000° C. with a pressure ranging from approximately 0.1 Torr to approximately 760 Torr.

As shown in FIG. 5B, a first conductive type epitaxial layer 312 is formed over a predetermined portion of the first conductive type substrate 303 exposed by the selective etching process of the mask pattern 311. The mask pattern 311 is removed by using a solution of hydrogen fluoride (HF) after the first conductive type epitaxial layer 312 is formed.

Herein, the first conductive type epitaxial layer 312 is a pinning layer including one of Si and SiGe, and can be formed to contact the first conductive type substrate 303.

Also, first conductive type impurities can be doped in-situ while growing the first conductive type epitaxial layer 312, and the first conductive type impurities can be doped in-situ using a $B_2H_6$ source gas at a doping concentration level ranging from approximately $1 \times 10^{18}$ $cm^{-3}$ to approximately $5 \times 10^{21}$ $cm^{-3}$.

Moreover, when forming the first conductive type epitaxial layer 312 with SiGe, a Si source selected from the group consisting of DSC, $SiH_4$, and $Si_2H_6$ and a Ge source of $GeH_4$ are used at a temperature ranging from approximately 500° C. to approximately 900° C. by employing a SEG method.

Furthermore, when forming the first conductive type epitaxial layer 312 with Si, the first conductive type epitaxial layer 312 is formed at a temperature ranging from approximately 550° C. to approximately 900° C., using the SEG method.

Also, the first conductive type impurities contained in the first conductive type epitaxial layer 312 can be doped in-situ using a $B_2H_6$ source gas at a doping concentration level ranging from approximately $1 \times 10^{18}$ cm$^{-3}$ to approximately $5 \times 10^{21}$ cm$^{-3}$.

As described above, the first and the second embodiments of the present invention can secure the shallow P-type impurity region having a uniform doping level by employing the Si or SiGe epitaxial layer doped in-situ as the first conductive type epitaxial layer, wherein the first conductive type epitaxial layer is the P-type impurity region formed over the photodiode made of P/N/P junction.

Thus, controlling of a pinning voltage becomes easy, and the specific embodiments of this invention can be easily embodied without additional alterations of the layout by altering the designs of photoelectric conversion efficiency of a blue region, which has become a limitation in a visible light region.

Also, by shallowly forming the P-type impurity region, the N-type impurity region can be formed thickly, thus, an optical carrier generation is increased.

Furthermore, by removing the silicon nitride layer over the epitaxial layer, wherein the silicon nitride layer functions as the contact hole etch stop layer, light receiving efficiency is increased.

Moreover, because the epitaxial layer is doped in-situ during the growth, a dangling bond defect caused by the ion implantation process can be resolved and the noise can be removed.

The present application contains subject matter related to the Korean patent application No. KR 2005-0062300, filed in the Korean Patent Office on Jul. 11, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating an image sensor comprising:
   preparing a first conductive substrate;
   forming first trenches in the first conductive substrate to define an active region and device isolation regions;
   forming a gate electrode over the active region of the first conductive substrate;
   forming a second conductive impurity region in the active region of the first conductive substrate;
   forming a floating diffusion region on one side of the gate electrode in the active region of the first conductive substrate;
   etching a predetermined portion of the second conductive impurity region and a predetermined portion of the active region of the first conductive substrate to form a second trench between the gate electrode and the first trench, wherein the first trenches are deeper than the second trench; and
   burying a first conductive epitaxial layer in the second trench by in-situ doping first conductive impurities while growing the first conductive epitaxial layer, wherein the first conductive epitaxial layer includes one of Si and SiGe.

2. The method of claim 1, wherein the first conductive type impurities are doped in-situ using a diborane ($B_2H_6$) source gas at a doping concentration level ranging from approximately $1 \times 10^{18}$ cm$^{-3}$ to approximately $5 \times 10^{21}$ cm$^{-3}$.

3. The method of claim 1, wherein the second conductive impurity region is self-aligned with an edge of the other side of the gate electrode where the photodiode is to be formed.

4. The method of claim 1, wherein the SiGe includes a Si source selected from the group consisting of di-chloro-silane (DCS), silane ($SiH_4$), and disilane ($Si_2H_6$) and a Ge source of germane ($GeH_4$).

5. The method of claim 1, wherein the Si is formed at a temperature ranging from approximately 550° C. to approximately 900° C. using a selective epitaxial growing (SEG) method.

6. The method of claim 1, wherein the SiGe is formed at a temperature ranging from approximately 500° C. to approximately 900° C. using a SEG method.

7. The method of claim 1, wherein the forming of the second trench includes forming the second trench in a depth ranging from approximately 1 Å to approximately 100 Å.

8. A method for fabricating an image sensor comprising:
   preparing a first conductive substrate;
   forming first trenches in the first conductive substrate to define an active region and device isolation regions;
   forming a gate electrode over the active region of the first conductive substrate;
   forming a second conductive impurity region in the active region of the first conductive substrate;
   forming spacers on sidewalls of the gate electrode;
   forming a floating diffusion region on one side of the gate electrode in the active region of the first conductive substrate;
   forming a mask pattern by employing a chemical vapor deposition (CVD) method to expose a predetermined portion of the second conductive impurity region and a predetermined portion of the active region of the first conductive substrate; and
   forming a first conductive epitaxial layer over the exposed portion of the second conductive impurity region and the first conductive substrate by in-situ doping first conductive impurities while growing the first conductive epitaxial layer, wherein the first conductive epitaxial layer includes one of Si and SiGe.

9. The method of claim 8, wherein the second conductive impurity region is self-aligned with an edge of the other side of the gate electrode where the photodiode is to be formed.

10. The method of claim 8, wherein the first conductive impurities are doped in-situ using a $B_2H_6$ source gas at a doping concentration level ranging from approximately $1 \times 10^{18}$ cm$^{-3}$ to approximately $5 \times 10^{21}$ cm$^{-3}$.

11. The method of claim 8, wherein the first conductive epitaxial layer is formed in a thickness ranging from approximately 50 Å to approximately 500 Å.

12. The method of claim 8, wherein the SiGe includes a Si source selected from the group consisting of DCS, $SiH_4$, and $Si_2H_6$ and a Ge source of $GeH_4$.

13. The method of claim 8, wherein the first conductive epitaxial layer including Si is formed at a temperature ranging from approximately 550° C. to approximately 900° C. using a SEG method, and the first conductive epitaxial layer including SiGe is formed at a temperature ranging from approximately 500° C. to approximately 900° C. using a SEG method.

14. The method of claim 8, wherein the forming of the mask pattern includes comprising an oxide layer.

15. The method of claim 8, wherein the forming of the mask pattern includes forming the mask pattern by performing an etching process using hydrogen chloride (HCl) under a specific recipe of a pressure ranging from approximately 0.1 Torr to approximately 760 Torr.

* * * * *

UNITED STATES PATENT AND TRADEMARK OFFICE
CERTIFICATE OF CORRECTION

| | | |
|---|---|---|
| PATENT NO. | : 7,608,192 B2 | Page 1 of 1 |
| APPLICATION NO. | : 11/408206 | |
| DATED | : October 27, 2009 | |
| INVENTOR(S) | : Kim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 175 days.

Signed and Sealed this

Twelfth Day of October, 2010

David J. Kappos
*Director of the United States Patent and Trademark Office*

UNITED STATES PATENT AND TRADEMARK OFFICE
CERTIFICATE OF CORRECTION

PATENT NO. : 7,608,192 B2  Page 1 of 1
APPLICATION NO. : 11/408206
DATED : October 27, 2009
INVENTOR(S) : Hee Jeen Kim and Han Seob Cha It is certified that error appears in the above-identified patent and that said Letters Patent is hereby corrected as shown below:

Column 8, line 9, delete "550° C." and insert --550° C--;

Column 8, line 10, delete "900° C." and insert --900° C--;

Column 8, line 12, delete "500° C." and insert --500° C--;

Column 8, line 13, delete "900° C." and insert --900° C--;

Column 8, line 53, delete "550° C." and insert --550° C--;

Column 8, line 53, delete "900° C." and insert --900° C--;

Column 8, line 56, delete "500° C." and insert --500° C--;

Column 8, line 56, delete "900° C." and insert --900° C--.

Signed and Sealed this

Ninth Day of November, 2010

David J. Kappos
*Director of the United States Patent and Trademark Office*